United States Patent [19]

Fujimoto

[11] Patent Number: 4,983,919

[45] Date of Patent: Jan. 8, 1991

[54] FREQUENCY RESPONSE DETECTION APPARATUS

[75] Inventor: Hideki Fujimoto, Tokyo, Japan

[73] Assignee: Pioneer Electronic Corporation, Tokyo, Japan

[21] Appl. No.: 363,768

[22] Filed: Jun. 9, 1989

[30] Foreign Application Priority Data

Oct. 31, 1988 [JP] Japan ............................ 63-142275

[51] Int. Cl.$^5$ ............................................ G01R 23/16
[52] U.S. Cl. ........................................ 324/77 E; 455/3
[58] Field of Search ............... 324/77 B, 77 E, 77 R, 324/78 R, 78 F; 364/483–485, 726, 724; 340/347 SH; 455/3

[56] References Cited

U.S. PATENT DOCUMENTS 4,612,665 9/1986 Inami et al. ................. 324/77 E
4,665,494 5/1987 Tanaka et al. ................. 324/77 B
4,829,570 5/1989 Schotz ........................... 455/3

Primary Examiner—Michael J. Tokar
Attorney, Agent, or Firm—Foley & Lardner, Schwartz, Jeffery, Schwaab, Mack, Blumenthal & Evans

[57] ABSTRACT

An apparatus for detecting frequency response of audio signals of left and right channels. The audio signals of the left and right channels are alternately introduced at a predetermined periodic rate with intervals of a predetermined duration between times of signal introduction, the introduced audio signals are detected after being divided into a plurality of frequency band signals by band-pass filters, and one of the detected outputs is in turn relayed selectively. During the above described intervals of predetermined duration, an output end of detection device is grounded and the gain of the band-pass filters are made substantially equal to zero in synchronism with the timing of the grounding.

2 Claims, 1 Drawing Sheet

Fig. 1
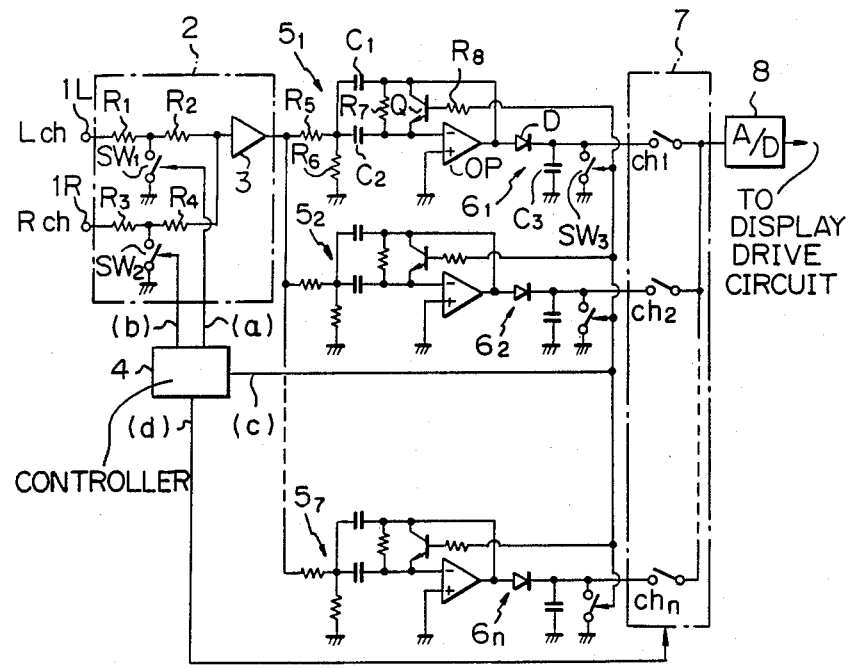
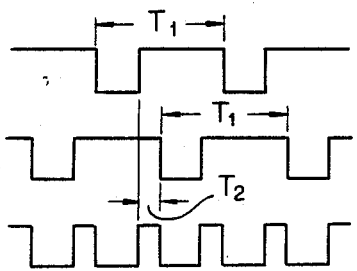
Fig. 2A
Fig. 2B
Fig. 2C

FREQUENCY RESPONSE DETECTION APPARATUS

BACKGROUND OF THE INVENTION

1. Field of the Invention

The present invention relates to a frequency response detection apparatus, and more specifically to an apparatus for detecting the frequency response of audio signals.

2. Background Information

Apparatuses for detecting frequency response such as the spectrum analyzer, are designed so that the audio band is divided into a plurality of frequency bands, and the signal level is detected for each of the plurality of frequency bands. Such apparatuses are provided with means for dividing the audio signal into a plurality of frequency band signals, means for respectively detecting the frequency band signals, and means for switching and in turn relaying one of the detection output signals. The relayed detection output signal is treated by an A/D (analog-to-digital) conversion process, and then used as a drive input signal of a two-dimensional display means such as an LED (light-emitting diode) display device so that the detected frequency response is displayed as the frequency spectrum.

In the case where the frequency response is detected for each of the audio signals of the L (left) and R (right) channels with this type of frequency response detection apparatus, a circuit having the above described construction is provided separately for each of the left and right channels. Therefore, there inevitably is an increase in number of the circuit elements constituting the apparatus, and cost increases have resulted.

Hence, it is conceivable to detect the frequency response of each of the audio signals of L and R channels by a time-division process in order to use the circuit commonly for the signals of both channels. In this case, however, it is necessary that the frequency response can be surely detected for each of the channels.

OBJECT AND SUMMARY OF THE INVENTION

The present invention has been made under these circumstances, and an object of the present invention is to provide a frequency response detection apparatus which is capable of surely detecting the frequency response for each of the channels.

In order to attain the above object, the frequency response detection apparatus according to the present invention is characterized by introducing the audio signals of the L and R channels alternately at a predetermined periodic rate, while interposing intervals of a predetermined duration between signal introduction periods, dividing the introduced signal to a plurality of frequency band signals by means of band pass filters and detecting the signal of each band by means of a detecting means, respectively. One of the detection output signals is relayed in turn, and an output end of the detection means is grounded during the above-described quiescent period, and a control operation is performed so that the gain of one of the band-pass filters is made substantially equal to zero in synchronism with the timing of grounding.

BRIEF DESCRIPTION OF THE DRAWINGS

FIG. 1 is a circuit diagram showing an embodiment of the frequency response detection apparatus according to the present invention; and FIGS. 2A, 2B, and 2C are waveform diagrams showing the circuit operation of the apparatus shown in FIG. 1.

DETAILED DESCRIPTION OF THE PREFERRED EMBODIMENT

The preferred embodiment of the present invention will be specifically explained with reference to the accompanying drawings hereinafter.

FIG. 1 shows the embodiment of the present invention. In FIG. 1, audio signals of the L and R channels are supplied to an input circuit 2 through input terminals 1L and 1R of the L and R channels. The input circuit 2 includes an amplifier 3, resistors $R_1$ and $R_2$ connected in series between the input terminals of the amplifier 3, a switch $SW_1$ connected between a common junction of the resistors $R_1$ and $R_2$ and ground, resistors $R_3$ and $R_4$ connected in series between the input terminal 1R and the input terminal of the amplifier 3, and a switch $SW_2$ connected between the common junction of the resistors $R_3$, $R_4$ and ground. In accordance with switch control signals (a) and (b), respectively, shown in FIGS. 2A and 2B issued from the controller 4, the switches $SW_1$ and $SW_2$ are controlled on and off, so that the input circuit 2 alternately introduces the audio signals of the channels L and R every predetermined period $T_1$ excluding intervals of a predetermined duration $T_2$ between the times of signal introduction.

The audio signals of the L and R channels introduced by the input circuit 2 are divided by means of BPF (Band Pass Filters) $5_1$ through $5_5$ for each respective frequency range, forming n band frequency signals. Each of the BPFs $5_1$ through $5_5$ consists of, taking example of the BPF $5_1$, an operational amplifier OP whose non-inverting input terminal is grounded, resistors $R_5$ and $R_6$ connected in series between the output end of the amplifier 3 and ground, capacitors $C_1$ and $C_2$ whose one ends are commonly connected to a junction of the resistors $R_5$ and $R_6$ and whose other ends are connected to the output end and the inverting input of the operational amplifier OP, respectively, and a resistor $R_7$ connected between the other ends of the capacitors $C_1$ and $C_2$. A transistor Q is connected in parallel with the resistor $R_7$, and driven to turn on during the predetermined time period $T_2$ by a reset signal (c), which is generated by the controller 4 and supplied to its base through a resistor $R_8$, as illustrated in FIG. 21.

The n band frequency signals which have been divided by the BPFs $5_1$ through $5_5$ are respectively rectified and smoothed out by detectors $6_1$ through $6_n$ which are made up of a diode D and a capacitor $C_3$. Between the output end of the detectors $6_1$ through $6_n$ and ground, there are respectively provided switches $SW_3$ which are driven to turn on by the above-described reset signal (c). Each detection output signal of the detectors $6_1$ through $6_n$ are respectively supplied to input terminals $ch_1$ through $ch_n$ of a repeater switch circuit 7. To the repeater switch circuit 7, a channel designation code signal (d) having binary digits whose number is equal to the number of channels is supplied in order from the controller 4 with a periodicity determined by the internal clock. The repeater switch circuit 7 selectively relays, in turn, one of the detection output signals supplied to the input terminals $ch_1$ through $ch_n$ which is designated by this channel designation signal. The detection output signal selected by the repeater switch circuit 7 is converted to a digital signal by an A/D converter 8, and supplied to the display drive circuit (not shown). The display drive circuit drives, for example, LED display devices of L and R channels alternately in accordance with the A/D conversion output signal in synchronism with the abovedescribed switch control signals (a) and (b).

The operation of the above-described circuit will be explained hereinafter.

The audio signals of L and R channels are alternately introduced at predetermined intervals $T_1$ with the constant periods $T_2$ remained between the signal introduction periods as a result of on-off control of the switches $SW_1$ and $SW_2$ by the switch control signals (a) and (b) illustrated in FIGS. 2A and 2B. The introduced audio signals of the L and R channels are respectively divided, according to the frequency band, into n band frequency signals. These signals are detected in the detector circuits $6_1$ through $6_n$ and supplied to the A/D converter circuit 8 after switched in turn and relayed by the repeater switch circuit 7.

As mentioned above, the audio signals of L and R channels are introduced alternately while constant periods $T_2$ are interposed between the signal introduction periods. In this constant period $T_2$, the output end of the detectors $6_1$ through $6_n$ are grounded as the switch $SW_3$ is switched on by the reset signal (c) generated at the controller 4. With this operation, leaking of the band frequency signal of one channel to the other channel is prevented.

However, because of the transitional response between the band frequency of each BPF $5_1$ through $5_n$ and the switching between the L and R channels, there can be a state where the detection output is generated after the switch $SW_3$ is turned off, although the switching of the channel has been completed. In other words, even though switching between the L and R channels are performed with the audio signal of only one channel inputted, the display level can appear on the display device of the opposite channel.

Hence, according to the present invention, the transistor Q is connected in parallel with each resistor $R_7$ of the BPF $5_1$ through $5_n$, and the transistor Q is driven by the reset signal (c). As the transistor Q is turned on, the resistor $R_7$ is short-circuited, to reduce the gain of the BPFs $5_1$ through $5_n$ substantially to zero, so that the electric charge of the capacitor $C_1$ is discharged to ground through the transistor Q and the operational amplifier OP at once, and the electric charge of the capacitor $C_2$ is discharged to ground through the operational amplifier OP at once. Thus, the leaking of the band frequency signal of one channel to the other channel is surely prevented.

In the above embodiment, the transistor Q is provided for every resistor $R_7$ of the BPFs $5_1$ through $5_n$, and the transistor is driven to turn on by the reset signal (c). However, since the speed of response to the switching between the L and R channels is faster in higher frequency bands, the problem described above will not arise in those frequency bands. Therefore, it is practically sufficient to provide the transistor Q in parallel with the resistor $R_7$ of the BPFs of only the low frequency bands, for example of the BPFs $5_1$ and $5_2$, and to turn the transistors Q on by the reset signal (c).

As explained in the foregoing, according to the present invention, the frequency response detection apparatus is configured to alternately introduce the audio signals of L and R channels with a predetermined periodicity while interposing intervals of a constant duration between the signal introduction periods, so that the band-pass filters and the detection means are commonly used, and a control operation is performed so that the output end of the detection means is grounded during the constant period and so that the gain of the band-pass filter is reduced to zero in synchronism with the timing of grounding. Therefore, the circuit construction of the apparatus is simplified and the reduction in cost and space of the apparatus is enabled, while detection of the frequency response is surely performed for the signal of each channel.

What is claimed is:

1. A frequency response detection apparatus comprising:
   an input means for alternately introducing audio signals from left and right channels at a predetermined periodic interval of a predetermined duration interposed between signal introduction periods;
   a plurality of frequency analyzing means for dividing said audio signals introduced by said input means into a plurality of frequency band signals;
   detector means for respectively detecting each of said plurality of frequency band signals;
   reset means for grounding an output end of said detector means in said intervals of said predetermined duration; and
   relay switch means for relaying in turn each of the detected output signals of said frequency band signals;
   wherein said frequency analyzing means includes a plurality of band-pass filters corresponding to said plurality of frequency band signals and a control means for making the gain of one of band-pass filters substantially equal to zero in synchronism with reset timings of said reset means.

2. An apparatus as set forth in claim 1, wherein each of said band-pass filters comprises an operational amplifier having a grounded noninverting input terminal, a first resistor having one end to which said audio signal being introduced is applied, first and second capacitors each having one end and another end, said one ends of said first and second capacitors being commonly connected to another end of said first resistor, and said another ends of said first and second capacitors being connected, respectively, to said output end and an inverting input terminal of said operational amplifier, and means for creating a short circuit across a resistor connected between said another ends of said first and second capacitors.

* * * * *